(12) United States Patent
Ono

(10) Patent No.: US 11,439,048 B2
(45) Date of Patent: Sep. 6, 2022

(54) ELECTRONIC COMPONENT HOUSING

(71) Applicant: Nissan Motor Co., Ltd., Kanagawa (JP)

(72) Inventor: Kimihiro Ono, Kanagawa (JP)

(73) Assignee: Nissan Motor Co., Ltd., Kanagawa (JP)

( * ) Notice: Subject to any disclaimer, the term of this patent is extended or adjusted under 35 U.S.C. 154(b) by 0 days.

(21) Appl. No.: 16/980,274

(22) PCT Filed: Mar. 12, 2018

(86) PCT No.: PCT/JP2018/009466
§ 371 (c)(1),
(2) Date: Sep. 11, 2020

(87) PCT Pub. No.: WO2019/175928
PCT Pub. Date: Sep. 19, 2019

(65) Prior Publication Data
US 2021/0029852 A1 Jan. 28, 2021

(51) Int. Cl.
*H05K 7/20* (2006.01)
*H05K 9/00* (2006.01)

(52) U.S. Cl.
CPC ..... *H05K 7/20927* (2013.01); *H05K 7/20272* (2013.01); *H05K 9/0049* (2013.01)

(58) Field of Classification Search
None
See application file for complete search history.

(56) References Cited

U.S. PATENT DOCUMENTS

| | | | |
|---|---|---|---|
| 7,113,406 B1 * | 9/2006 | Nguyen | H01L 23/4006 165/185 |
| 8,730,675 B2 * | 5/2014 | Sano | H04M 1/0202 361/710 |
| 9,681,565 B2 * | 6/2017 | Escamilla | H05K 5/03 |
| 9,756,718 B2 * | 9/2017 | Kataoka | H05K 3/284 |
| 10,772,245 B2 * | 9/2020 | Craig | H05K 7/20445 |
| 2010/0206517 A1 | 8/2010 | Asakura | |
| 2014/0009886 A1 * | 1/2014 | Moon | H05K 9/0007 361/699 |
| 2020/0068749 A1 * | 2/2020 | Ono | H05K 7/1407 |

FOREIGN PATENT DOCUMENTS

| | | |
|---|---|---|
| EP | 2116724 A1 | 11/2009 |
| JP | 2004-196134 A | 7/2004 |
| JP | 2009-045969 A | 3/2009 |
| JP | 2011-020627 A | 2/2011 |
| JP | 2011-233726 A | 11/2011 |
| JP | 2016-050570 A | 4/2016 |

* cited by examiner

*Primary Examiner* — Courtney L Smith
(74) *Attorney, Agent, or Firm* — Osha Bergman Watanabe & Burton LLP

(57) ABSTRACT

An electronic component housing that internally houses an electronic component includes a portion formed of a resin material and a portion formed of a metallic material. The portion formed of the resin material is a connection side portion opposed to a member as a connection partner of the electronic component housing, or an opposite portion opposed to the connection side portion. The electronic component housing further includes an electromagnetic shield member that covers an outer surface of the portion formed of the resin material.

10 Claims, 9 Drawing Sheets

EXTERNAL FORCE F

EXTERNAL FORCE F

ELECTRONIC COMPONENT HOUSING

TECHNICAL FIELD

The present invention relates to an electronic component housing that internally houses an electronic component.

BACKGROUND ART

JP2004-196134A discloses a housing that houses an electronic component, such as an inverter circuit, and the housing is a metal housing that has an electromagnetic wave shield function and a cooling function for cooling the electronic component.

SUMMARY OF INVENTION

Incidentally, an electronic component housing mounted to a hybrid vehicle and an electric vehicle is often mounted to what is called an engine room in the case of the hybrid vehicle, or mounted to what is called a motor room in the case of the electric vehicle. In the following description, the engine room and the motor room are referred to as an engine room and the like in some cases.

The engine room and the like are often disposed in a vehicle-body front portion, and have an easily deformed structure for reducing an impact at a collision. Therefore, at a collision, a deformed vehicle-body frame member, other deformed or moved components, and the like possibly interfere with the electronic component housing. Then, the electronic component housing is deformed or damaged due to an external force applied by the interference, thereby damaging the housed electronic component or exposing the housed electronic component to possibly cause an electric leakage. In view of this, the electronic component housing requires a strength where the deformation or the damage is avoided even when the external force is applied by the collision and the like. However, increasing the strength increases weight and cost.

Therefore, it is an object of the present invention to provide an electronic component housing configured to reduce a damage and an electric leakage of an electronic component due to a collision while suppressing increase in weight and cost.

An electronic component housing according to an embodiment of the present invention is an electronic component housing that internally houses an electronic component, and includes a portion formed of a resin material and a portion formed of a metallic material. The portion formed of the resin material is a connection side portion opposed to a member as a connection partner of the electronic component housing, or an opposite portion opposed to the connection side portion. The electronic component housing further includes an electromagnetic shield member that covers an outer surface of the portion formed of the resin material.

DESCRIPTION OF EMBODIMENTS

The following describes embodiments of the present invention with reference to the drawings and the like.

First Embodiment

The first embodiment will be described with reference to FIG. 1 to FIG. 8.

In this embodiment, a description will be given of a case where an electronic component housing is a housing of an inverter 22 for an electric vehicle.

Figure 1:
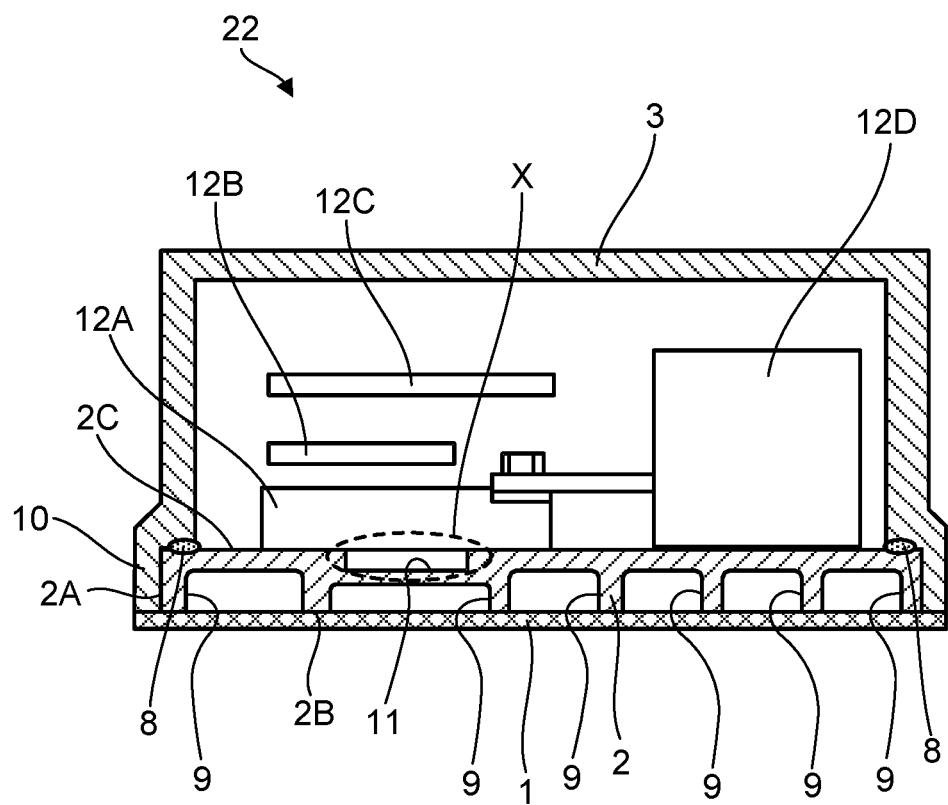
FIG. 1 is a cross-sectional view of an inverter to which a first embodiment is applied.
Figure 2:
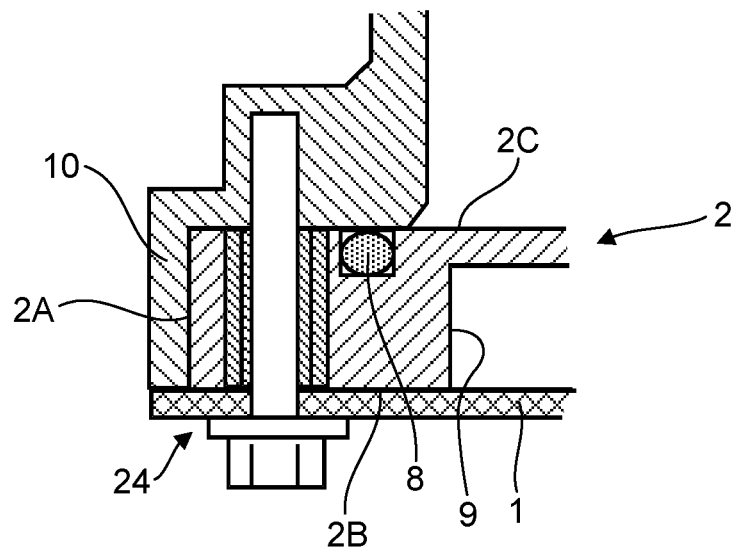
FIG. 2 is a cross-sectional view of a bolt fastening portion of a housing.

FIG. 1 is a cross-sectional view of the inverter 22 to which an electronic component housing according to the embodiment is applied. FIG. 2 is a cross-sectional view of a fastening portion of a resin member 2 and a metal thin plate 1 to a metal member 3 described later.

The inverter 22 includes a housing that includes the metal member 3, the resin member 2, and the metal thin plate 1. The housing internally houses electronic components 12A to 12D. Hereinafter, these electronic components 12A to 12D are referred to as inverter's internal components 12A to 12D.

The metal member 3 is a box-shaped member having one open surface, and molded by, for example, die casting.

The resin member 2 is a plate-shaped member that closes the opening of the metal member 3. As a material forming the resin member 2, for example, polyphenylene sulfide (PPS) and polyphthalamide (PPA) are used. The resin member 2 includes a plurality of punched portions 9 for improving formability, and a refrigerant flow channel 11 for cooling the components housed in the housing. The refrigerant flow channel 11 will be described in detail later.

The metal thin plate 1 is a plate material that covers an outer surface 2B of the resin member 2. The metal thin plate 1 is, for example, an aluminum plate having a thickness of about 1 mm. Here, the outer surface 2B of the resin member 2 is a surface on an outer side in a state where the opening of the metal member 3 is closed by the resin member 2. In contrast, a surface on an inner side is referred to as an inner surface 2C.

The metal member 3 and the resin member 2 are bolted together via a sealing member 8 for ensuring waterproof performance as illustrated in FIG. 2. The entire housing includes a plurality of bolt fastening portions 24.

At the bolt fastening portion 24, a collar using a metal material, such as brass, is inserted into a bolt hole of the resin member 2, thereby suppressing buckling of the resin member 2 at bolting to ensure strength of the bolt fastening portion 24.

The metal member 3 includes a flange, abutting on the resin member 2, that includes a collar 10 that covers a side surface 2A of the resin member 2. The collar 10 covers the side surface 2A of the resin member 2, and the metal thin plate 1 covers the outer surface 2B of the resin member 2, thus ensuring magnetic shield performance of the housing.

The inverter's internal components 12A to 12D housed in the housing are secured to the inner surface 2C of the resin member 2 as illustrated in FIG. 1. The inverter's internal components 12A to 12D are, for example, a smoothing capacitor, a power module, a busbar, and a control board. The housing covers and surrounds, or wraps and surrounds the internally arranged inverter's internal components 12A to 12D from substantially all circumferential directions to protect the inverter's internal components 12A to 12D.

Next, the refrigerant flow channel 11 will be described.

Figure 3:
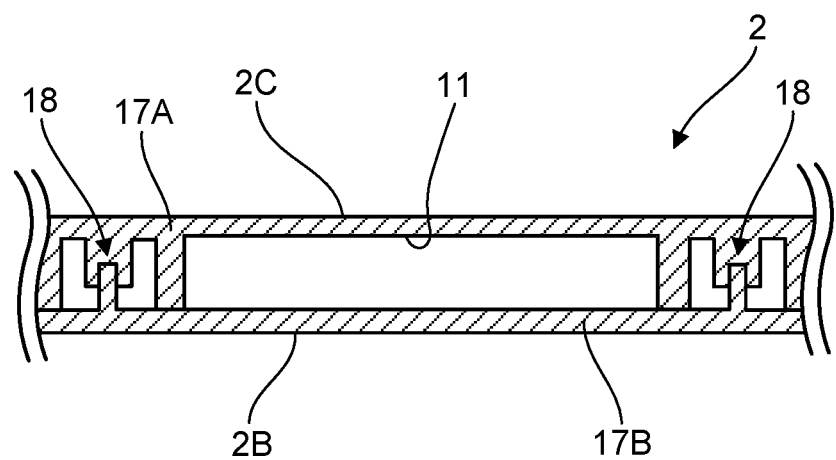
FIG. 3 is a cross-sectional view of a refrigerant flow channel.

FIG. 3 is an enlarged view of a region X enclosed by a dashed line of FIG. 1. The resin member 2 includes a first member 17A and a second member 17B. The first member 17A and the second member 17B are welded together at a welding portion 18, thereby forming a groove provided on the first member 17A as the refrigerant flow channel 11. The refrigerant flow channel 11 provides watertight performance ensured by the welding portion 18.

Figure 4:
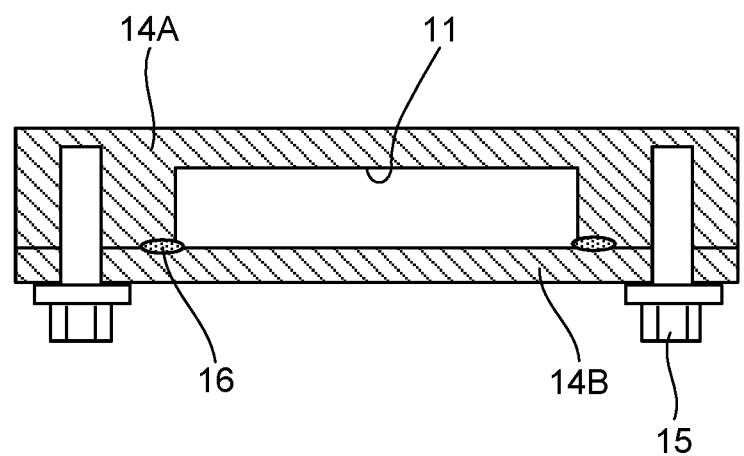
FIG. 4 is a cross-sectional view of the refrigerant flow channel when a metal is used.

FIG. 4 illustrates a configuration of the refrigerant flow channel 11 when a metal member, such as aluminum die-cast, is used instead of the resin member 2 as a comparative example. Also in this case, two metal members 14A and 14B are used, and the one metal member 14A is provided with a groove. However, a sealing member 16, such as a liquid gasket and a rubber gasket, and a bolt 15 for fastening are required, and the component configuration becomes complicated. Furthermore, since metal has poor workability compared with resin, the cost needed for flow passage formation increases.

That is, the use of the resin member 2 ensures the formation of the compact refrigerant flow channel 11 at low-price compared with the case of using the metal member.

Next, a mounting position of the inverter 22 will be described.

Figure 5:
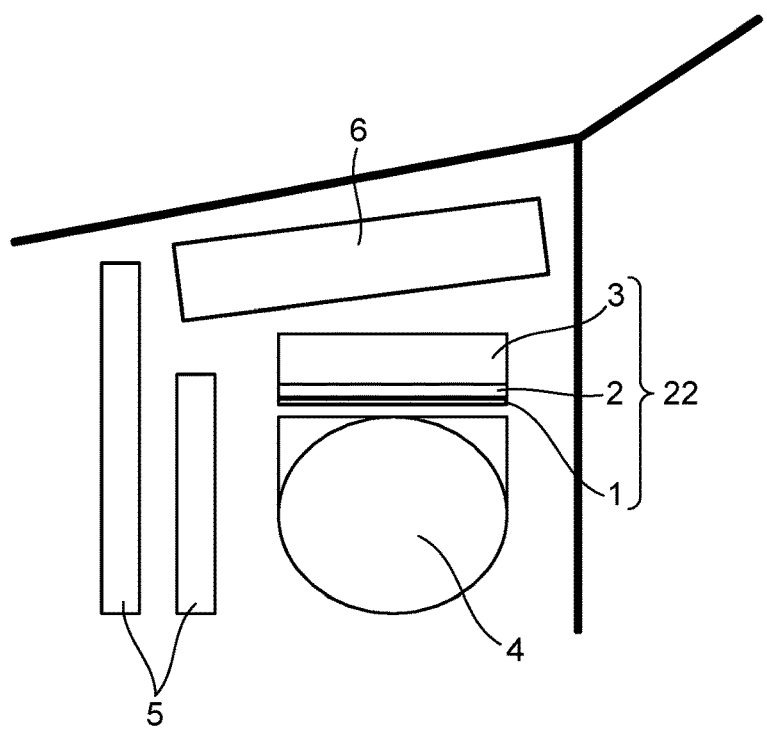
FIG. 5 is a cross-sectional view of an inside of a motor room of the first embodiment.

FIG. 5 is a schematic cross-sectional view of a motor room of an electric vehicle. In the drawing, the left side is a vehicle front side and the right side is a vehicle rear side.

In the motor room, in addition to the inverter 22, an electric motor 4 as a power source, a radiator 5, an electronic component 6 such as a controller, and the like are installed.

The inverter 22 is installed on a top surface of a housing of the electric motor 4. That is, in this embodiment, a connection partner of the inverter 22 is the electric motor 4, and a connection side portion is a lower surface of the housing.

The resin member 2 and the metal thin plate 1 are installed opposed to the top surface of the housing of the electric motor 4. The radiator 5 is installed on the front side with respect to the electric motor 4 so as to be blown by travelling air. The electronic component 6 is installed in a space on the upper side with respect to the inverter 22.

Figure 6:
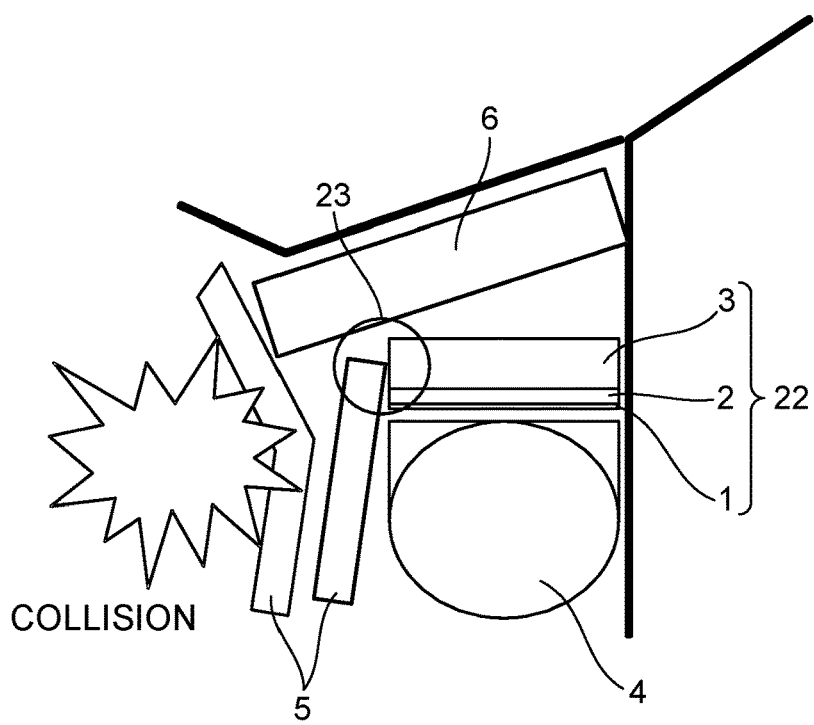
FIG. 6 is a cross-sectional view of the motor room at a vehicle collision.

FIG. 6 is a schematic cross-sectional view of the motor room at a collision of a vehicle having the above-described configuration from the vehicle front side.

When the vehicle collides from the front side, the radiator 5 pushed toward the vehicle rear side contacts the inverter 22, thereby possibly applying an external force to the inverter 22. However, even if the contact occurs, as illustrated in FIG. 6, it is highly possible that a contact portion 23 of the radiator 5 and the inverter 22 is a side surface of the inverter 22.

When a housing of the inverter 22 is deformed by the application of the external force due to the vehicle collision and the internal component is exposed, electric leakage possibly occurs from the exposed component. However, since the side surface of the housing of the inverter 22 is the metal member 3, the deformation to expose the internal component is suppressed.

Since the electric motor 4 is installed immediately below the lower surface of the inverter 22, it is less possible that the lower surface of the inverter 22 becomes the contact portion 23 to the radiator 5. Accordingly, there is a low risk of the electric leakage even if the lower surface of the inverter 22 is formed of a resin having a low rigidity compared with the side surface. Furthermore, the use of the resin ensures weight reduction.

As described above, by forming the portion having the low possibility of becoming the contact portion 23 in the housing of the inverter 22 with the resin member 2, the weight reduction is ensured while reducing the risk of the electric leakage at a vehicle collision.

Figure 7:
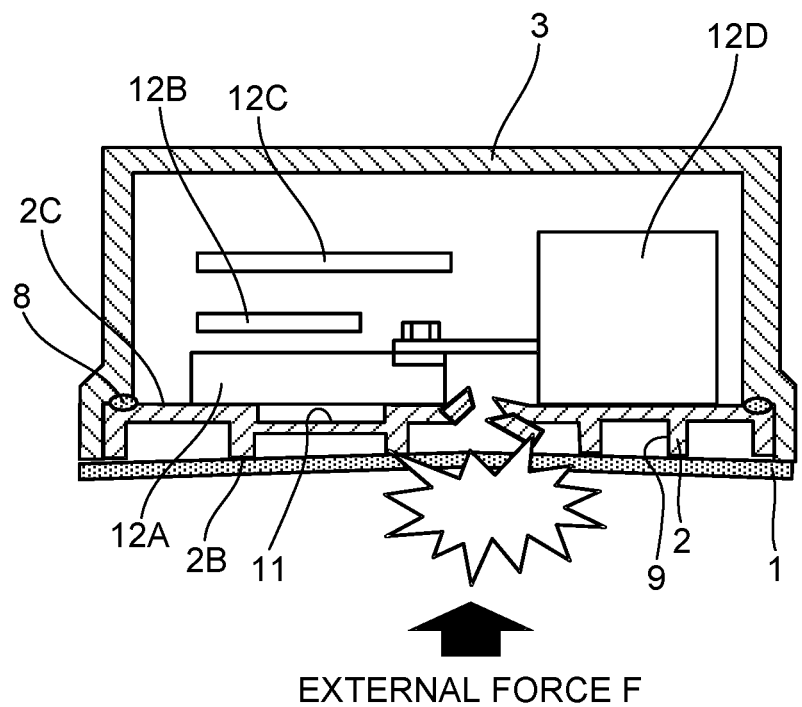
FIG. 7 is a cross-sectional view of the inverter when an external force is applied from a lower surface side.

FIG. 7 is a drawing illustrating a case where the external force is applied to the housing of the inverter 22 from the lower side.

As described above, at a vehicle collision, there is a low possibility that the external force is applied from the lower surface of the housing formed of the resin member 2 and the metal thin plate 1. However, for example, when any component enters a space between the electric motor 4 and the inverter 22, the external force is applied from the lower surface of the housing. In this case, even if the resin member 2 is damaged as illustrated in FIG. 7, the metal thin plate 1 extends corresponding to the external force, thus ensuring avoidance of the exposure of the internal components. That is, while assuming a magnitude of the external force to be input, the metal thin plate 1 is designed such that the metal thin plate 1 is not broken insofar as the external force is within the assumed range, thereby ensuring avoidance of the electric leakage at a vehicle collision even if a part of the housing is resin.

Figure 8:
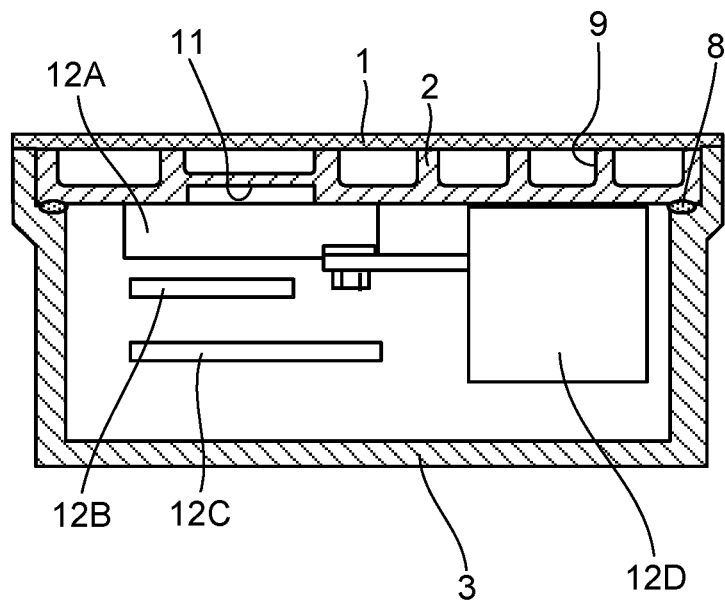
FIG. 8 is a drawing illustrating a modification of the inverter of the first embodiment.

While the lower surface of the housing of the inverter 22 as the connection side portion is formed of the resin member 2 and the metal thin plate 1 in the above description, an opposite portion opposed to the connection side portion may be formed of the resin member 2 and the metal thin plate 1. That is, as illustrated in FIG. 8, the top surface of the housing of the inverter 22 may be formed of the resin member 2 and the metal thin plate 1. This is because the top surface of the housing of the inverter 22 also has a low possibility of becoming the contact portion 23 to the radiator 5 similarly to the lower surface.

While the inverter's internal components 12A to 12D are installed on the resin member 2 in FIG. 1 and FIG. 8, the inverter's internal components 12A to 12D may be installed on the metal member 3.

As described above, the electronic component housing of this embodiment includes the portion formed of the resin material (resin member 2) and the portion formed of the metallic material (metal member 3), and the resin member 2 is the connection side portion opposed to the member as the connection partner, or the opposite portion opposed to the connection side portion. The electronic component housing further includes the metal thin plate 1 as an electromagnetic shield member that covers the outer surface of the resin member 2. Since the connection side portion and the opposite portion described above have the low risk of being damaged at a vehicle collision compared with the other portions, the risk of the damage and the electric leakage due to the damage can be reduced even if the resin material having the rigidity lower than that of the metallic material is used. The resin material is easily worked and lightweight compared with the metallic material. Furthermore, by covering the outer surface of the resin member 2 with the metal thin plate 1, the magnetic shield performance is ensured. That is, according to this embodiment, increase in weight and cost can be suppressed and the damage and the electric leakage of the electronic components due to the vehicle collision can be suppressed without reducing the magnetic shield performance.

The electronic component housing of this embodiment uses the metal thin plate 1 having ductility higher than that of the resin member 2 as the electromagnetic shield member. Accordingly, even if the resin member 2 is damaged, the metal thin plate 1 extends to ensure the magnetic shield performance.

The electronic component housing of this embodiment includes the refrigerant flow channel 11 that cools the electronic components on the resin member 2. Since the resin member 2 is used for the portion having the low risk of being damaged at a vehicle collision, disposing the refrigerant flow channel 11 here reduces the need for increasing the rigidity of the flow channel. Since the resin material has workability higher than that of the metallic material, the refrigerant flow channel 11 can be easily formed at low-price.

Second Embodiment

The second embodiment will be described with reference to FIG. 9.

Figure 9:
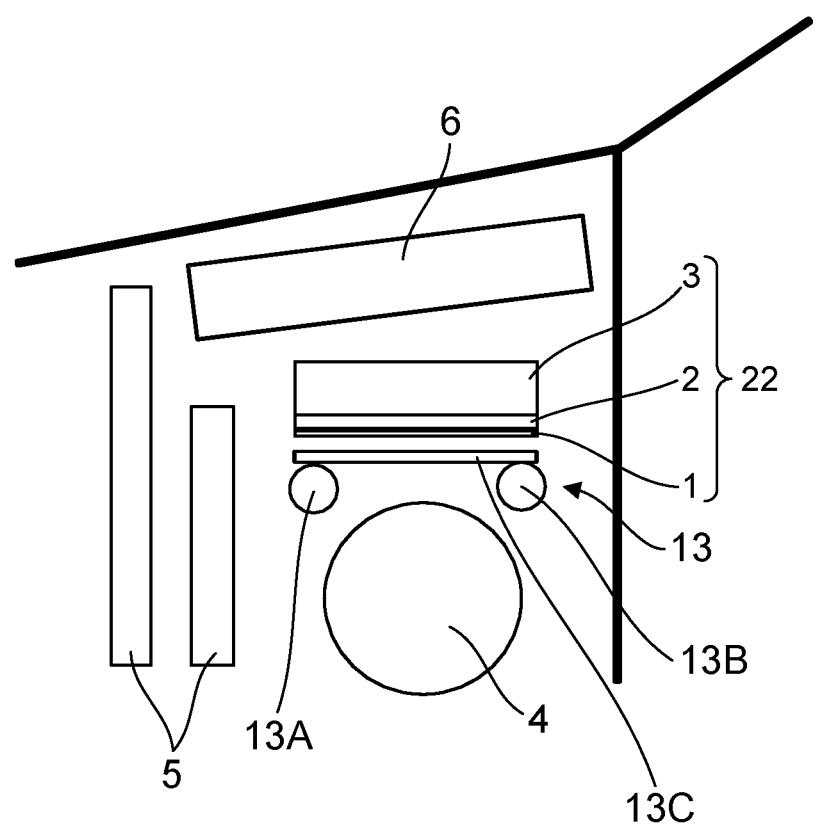
FIG. 9 is a cross-sectional view of a motor room of a second embodiment.

FIG. 9 is, similarly to FIG. 5, a schematic cross-sectional view of the motor room of the electric vehicle. In the drawing, the left side is a vehicle front side and the right side is a vehicle rear side. A difference from FIG. 5 is that the inverter 22 is installed to a mount portion 13. That is, in this embodiment, the connection partner of the inverter 22 is the mount portion 13.

The mount portion 13 includes two cross members 13A and 13B along a vehicle width direction, and a sub member 13C installed across the cross members 13A and 13B. The cross members 13A and 13B are installed across two front side members (not illustrated) disposed along the vehicle front-rear direction on both sides in the vehicle width direction of the motor room.

The inverter 22 is mounted to the mount portion 13 so as to have the surface formed of the resin member 2 and the metal thin plate 1 opposed to the sub member 13C. Since the mount portion 13 is formed of vehicle body frame members, such as the cross members 13A and 13B, the rigidity is ensured. Accordingly, by mounting the inverter 22 to the mount portion 13, the possibility that the external force is applied to the surface formed of the resin member 2 and the metal thin plate 1 at a vehicle collision is reduced similarly to the case of mounting the inverter 22 to the housing top surface of the electric motor 4.

As described above, the connection partner of the electronic component housing of this embodiment is the vehicle body frame member for securing the electronic component housing. Accordingly, the risk of damaging the resin member 2 at a vehicle collision is more reduced.

Third Embodiment

The third embodiment will be described with reference to FIG. 10 and FIG. 11.

Figure 10:
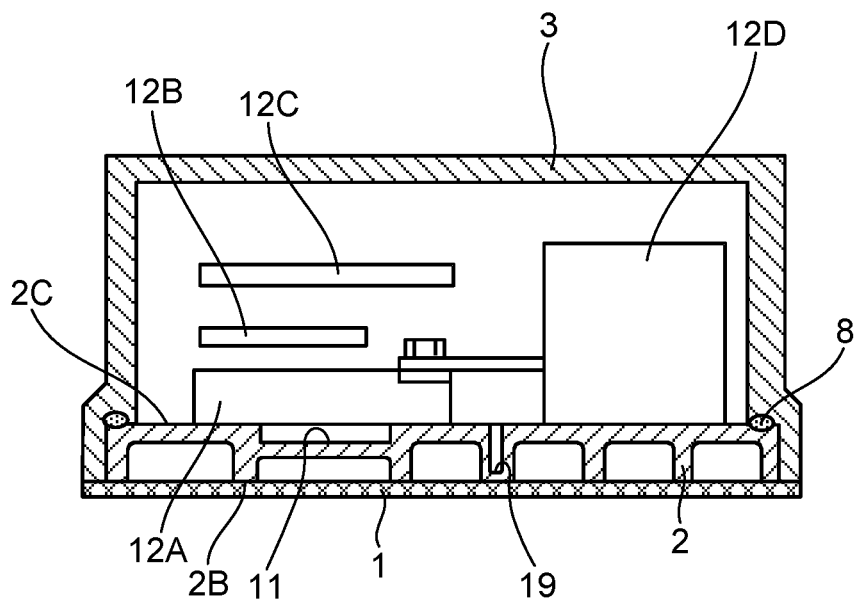
FIG. 10 is a cross-sectional view of an inverter to which a third embodiment is applied.
Figure 11:
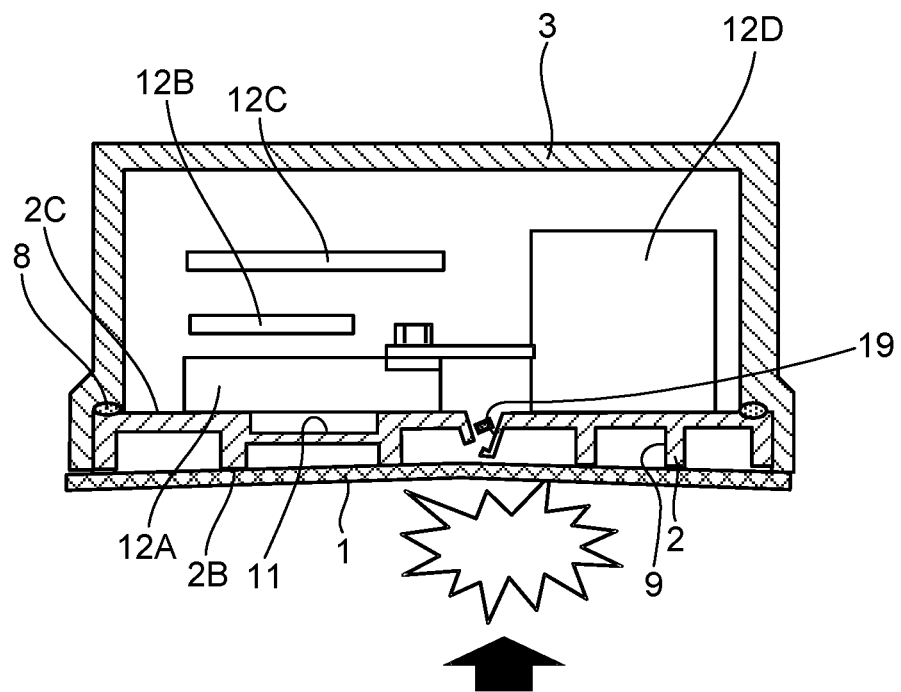
FIG. 11 is a cross-sectional view of the inverter when an external force is applied from a lower surface side.

FIG. 10 is a cross-sectional view of the inverter 22. A difference from FIG. 1 is that the resin member 2 includes a groove-shaped notch 19 at a position apart from the refrigerant flow channel 11 by a predetermined distance. The "predetermined distance" will be described later. FIG. 11 is a drawing illustrating a state where the external force is applied to the resin member 2 and the metal thin plate 1.

The notch 19 has a width of about a few mm and a depth so as to have a residual thickness of the resin member 2 about a few mm. Accordingly, in the resin member 2, the notch 19 is a low strength portion. As illustrated in FIG. 11, when the external force is applied to break the resin member 2, the notch 19 is the starting point of the break.

The purpose of providing the notch 19 is avoidance of the break of the resin member 2 in an aspect where the refrigerant flow channel 11 is broken. In other words, when the resin member 2 is broken, the refrigerant flow channel 11 is avoided becoming the starting point of the break.

When the resin member 2 is broken from the notch 19 as the starting point, a portion close to the notch 19 is deformed more or less. In addition, when a distance from the notch 19 to the refrigerant flow channel 11 is short, the refrigerant flow channel 11 is possibly deformed to cause the refrigerant to flow out.

Accordingly, the "position apart from the refrigerant flow channel 11 by the predetermined distance" at which the notch 19 is provided is a position where the refrigerant flow channel 11 is not broken nor deformed even if the resin member 2 is broken from the notch 19 as the starting point. Since this position is determined by the factors such as the strength and the rigidity of the resin member 2, and further, the shape and the arrangement of the punched portions 9, the position is determined by adaptation for each product to which this embodiment is applied. In this embodiment, for example, the notch 19 is provided on the inner surface 2C at the position apart from the refrigerant flow channel 11 toward the vehicle rear side by at least 10 to 15 mm.

By providing the notch 19 as the starting point in the case of the break, the damage of the refrigerant flow channel 11 when the external force is applied can be avoided. By providing the notch 19 at the position apart from the refrigerant flow channel 11 by the predetermined distance, the deformation of the refrigerant flow channel 11 also can be avoided. Accordingly, the risk of causing the electric leakage due to the refrigerant flown out of the refrigerant flow channel 11 can be reduced.

As described above, this embodiment can further provide the following effects in addition to the effects similar to those of the first embodiment and the second embodiment.

In the electronic component housing of this embodiment, the resin member 2 includes the notch 19 as the low strength portion at the position apart from the refrigerant flow channel 11 by the predetermined distance. Accordingly, when the external force is applied at a vehicle collision, the resin member 2 is damaged from the notch 19 as the starting point positioned at the position apart from the refrigerant flow channel 11. That is, even if the resin member 2 is damaged, the damage of the refrigerant flow channel 11 can be avoided.

Fourth Embodiment

The fourth embodiment will be described with reference to FIG. 12 and FIG. 13.

Figure 12:
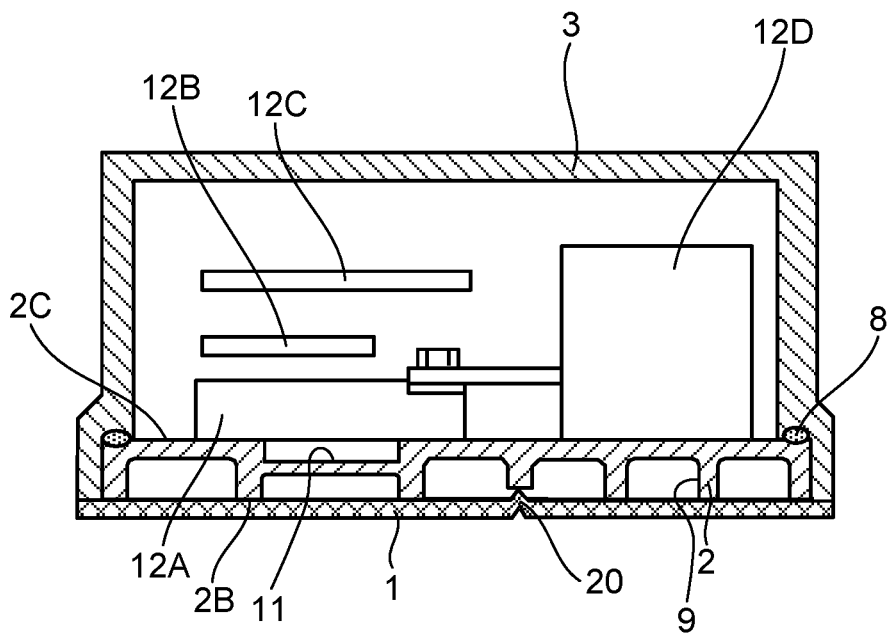
FIG. 12 is a cross-sectional view of an inverter to which a fourth embodiment is applied.

FIG. 12 is a cross-sectional view of the inverter 22. A difference from FIG. 1 is that the metal thin plate 1 includes a protrusion 20 at a position apart from a portion opposed to the refrigerant flow channel 11 by a predetermined distance. FIG. 13 is a drawing illustrating a state where the external force is applied to the resin member 2 and the metal thin plate 1.

The purpose of disposing the protrusion 20 is similar to the purpose of providing the notch 19 in the third embodiment. The "predetermined distance" in this embodiment is also similar to the "predetermined distance" in the third embodiment.

In this embodiment, the protrusion 20 is disposed at the position apart from the refrigerant flow channel 11 toward the vehicle rear side by at least 10 to 15 mm.

The protrusion 20 projects in an inward direction of the housing, and abuts on the outer surface 2B of the resin member 2. The protrusion 20 is formed by, for example, mountain-folding the metal thin plate 1, and has a height of about a few mm.

Figure 13:
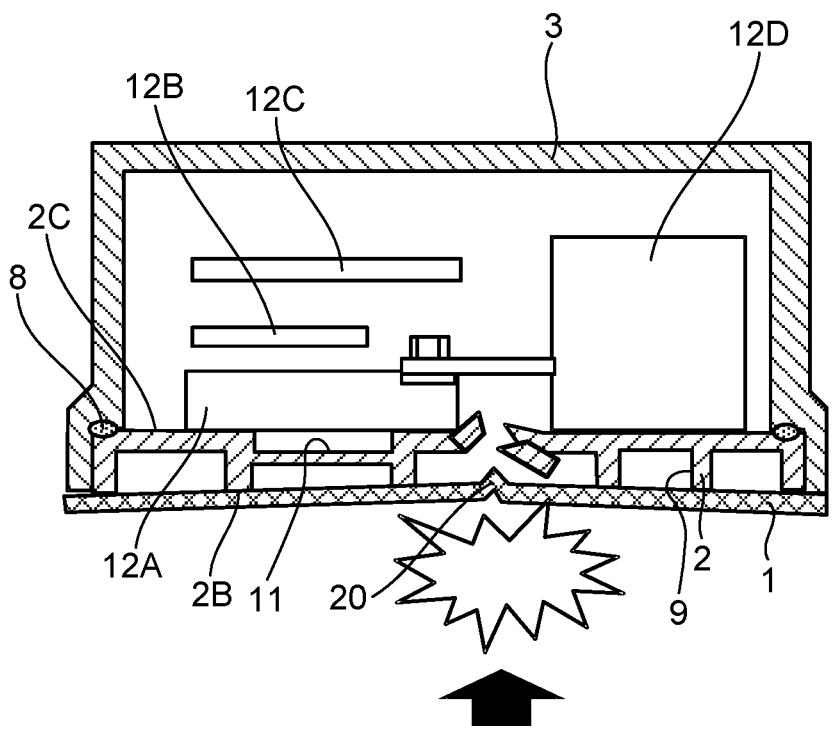
FIG. 13 is a cross-sectional view of the inverter when an external force is applied from a lower surface side.

Accordingly, as illustrated in FIG. 13, when the external force is applied to the resin member 2 and the metal thin plate 1, a stress is concentrated at the portion of the resin member 2 abutting on the protrusion 20, and this portion becomes the starting point in the case of the break. That is, similarly to the third embodiment, the risk of causing the electric leakage due to the break of the refrigerant flow channel 11 can be reduced.

As described above, this embodiment can further provide the following effects in addition to the effects similar to those of the first embodiment and the second embodiment.

In the electronic component housing of this embodiment, the metal thin plate 1 includes the protrusion 20 projecting in the inward direction of the housing at the position apart from the portion opposed to the refrigerant flow channel 11 by the predetermined distance. Accordingly, when the external force is applied at a vehicle collision, the resin member 2 can be damaged from the notch 19 as the starting point positioned at the position apart from the refrigerant flow channel 11. That is, even if the resin member 2 is damaged, the damage of the refrigerant flow channel 11 can be avoided.

Fifth Embodiment

The fifth embodiment will be described with reference to FIG. 14 and FIG. 15.

Figure 14:
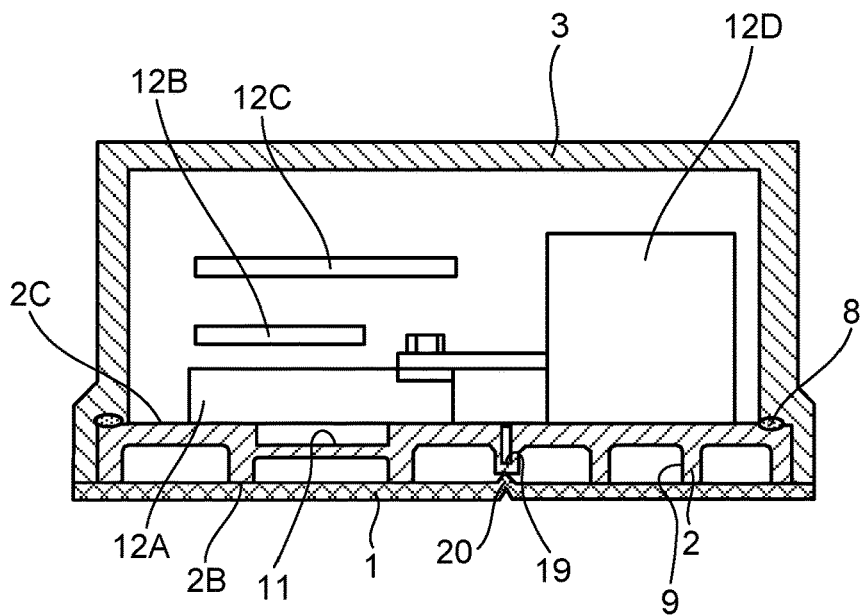
FIG. 14 is a cross-sectional view of an inverter to which a fifth embodiment is applied.

FIG. 14 is a cross-sectional view of the inverter 22. A difference from FIG. 1 is that the resin member 2 includes the notch 19 illustrated in FIG. 10 and the metal thin plate 1 includes the protrusion 20 illustrated in FIG. 14. FIG. 15 is a drawing illustrating a state where the external force is applied to the resin member 2 and the metal thin plate 1.

Similarly to the third embodiment, the notch 19 is provided on the inner surface 2C at the position apart from the refrigerant flow channel 11 by at least 10 to 15 mm. The notch 19 has the width of about a few mm, and the depth so as to have the residual thickness of the resin member 2 about a few mm.

The protrusion 20 projects in the inward direction of the housing, and abuts on the outer surface 2B at the portion where the notch 19 of the resin member 2 is provided.

Figure 15:
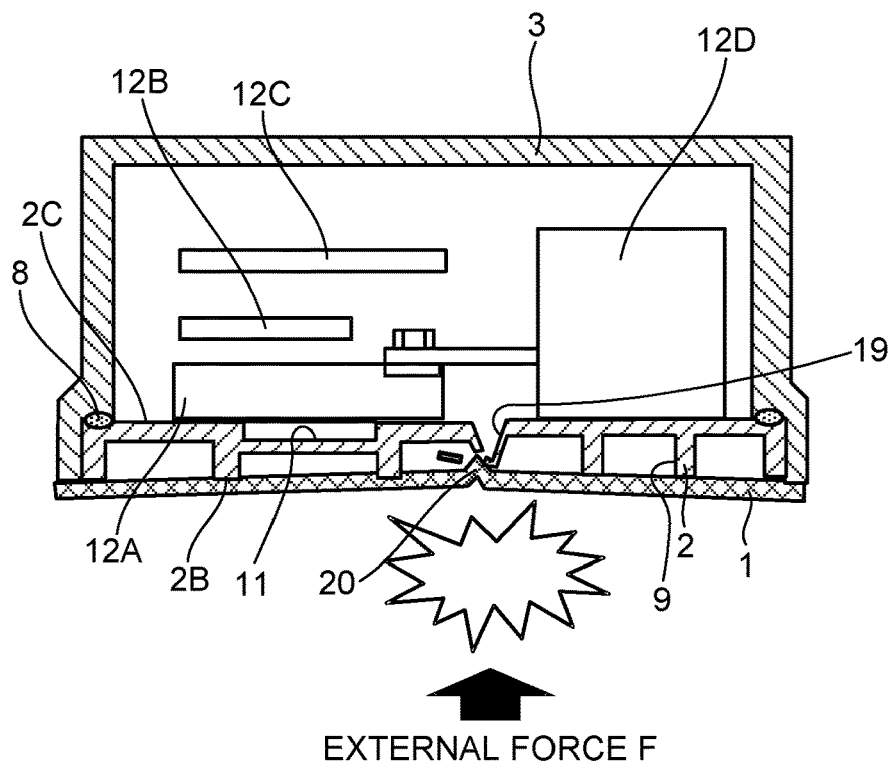
FIG. 15 is a cross-sectional view of the inverter when an external force is applied from a lower surface side.

Accordingly, as illustrated in FIG. 15, when the external force is applied to the resin member 2 and the metal thin plate 1, the stress is more easily concentrated at a bottom portion of the notch 19, and similarly to the third embodiment and the fourth embodiment, the risk of causing the electric leakage due to the break of the refrigerant flow channel 11 can be reduced.

As described above, this embodiment can further provide the following effects in addition to the effects similar to those of the first embodiment and the second embodiment.

In the electronic component housing of this embodiment, the resin member 2 includes the notch 19 as the low strength portion at the position apart from the refrigerant flow channel 11 by the predetermined distance, and the metal thin plate 1 includes the protrusion 20 projecting in the inward direction of the housing at the position opposed to the notch 19. Accordingly, when the external force is applied at a vehicle collision, the resin member 2 can be damaged from the notch 19 as the starting point with more certainty.

While the embodiments of the present invention are described above, the above-described embodiments describe merely a part of application examples of the present invention and the gist does not limit the technical scope of the present invention to the specific configuration of the embodiments.

The invention claimed is:

1. A housing of an inverter mounted to a vehicle that internally houses an electronic component, comprising:
   a portion formed of a resin material; and
   a portion formed of a metallic material, wherein
   the portion formed of the resin material is a connection side portion opposed to a member as a connection partner of the housing, or an opposite portion opposed to the connection side portion,
   the member as the connection partner is an electric motor,
   the connection side portion is a lower surface of the housing, and
   the housing further includes an electromagnetic shield member that covers an outer surface of the portion formed of the resin material.

2. The housing according to claim 1, wherein
   the electromagnetic shield member is a metal thin plate having a ductility higher than a ductility of the resin material.

3. The housing according to claim 1, wherein
   the portion formed of the resin material includes a refrigerant flow channel that cools the electronic component.

4. The housing according to claim 3, wherein
   the portion formed of the resin material includes a low strength portion at a position apart from the refrigerant flow channel by a predetermined distance.

5. The housing according to claim 3, wherein
   the electromagnetic shield member includes a protrusion projecting in an inward direction of the housing at a position apart from a portion opposed to the refrigerant flow channel by a predetermined distance.

6. The housing according to claim 3, wherein
   the portion formed of the resin material includes a low strength portion at a position apart from the refrigerant flow channel by a predetermined distance, and
   the electromagnetic shield member includes a protrusion projecting in an inward direction of the housing at a position opposed to the low strength portion.

7. An housing that internally houses an electronic component, comprising:
   a portion formed of a resin material; and
   a portion formed of a metallic material, wherein the portion formed of the resin material is a connection side portion opposed to a member as a connection partner of the electronic component housing, or an opposite portion opposed to the connection side portion, the electronic component housing further includes an electromagnetic shield member that covers an outer surface of the portion formed of the resin material, and the portion formed of the resin material includes a refrigerant flow channel that cools the electronic component.

8. The electronic component housing according to claim 7, wherein the portion formed of the resin material includes a low strength portion at a position apart from the refrigerant flow channel by a predetermined distance.

9. The electronic component housing according to claim 7, wherein the electromagnetic shield member includes a protrusion projecting in an inward direction of the electronic component housing at a position apart from a portion opposed to the refrigerant flow channel by a predetermined distance.

10. The electronic component housing according to claim 7, wherein the portion formed of the resin material includes a low strength portion at a position apart from the refrigerant flow channel by a predetermined distance, and the electromagnetic shield member includes a protrusion projecting in an inward direction of the electronic component housing at a position opposed to the low strength portion.

\* \* \* \* \*